(12) United States Patent
Laporte

(10) Patent No.: US 8,768,995 B2
(45) Date of Patent: Jul. 1, 2014

(54) MULTI-BRANCH RATE CHANGE FILTER

(75) Inventor: Pierre-Andre Laporte, Gatineau (CA)

(73) Assignee: Telefonaktiebolaget L.M. Ericsson (publ), Stockholm (SE)

( * ) Notice: Subject to any disclaimer, the term of this patent is extended or adjusted under 35 U.S.C. 154(b) by 622 days.

(21) Appl. No.: 13/119,163

(22) PCT Filed: Aug. 13, 2010

(86) PCT No.: PCT/IB2010/002148
§ 371 (c)(1),
(2), (4) Date: Mar. 15, 2011

(87) PCT Pub. No.: WO2012/028897
PCT Pub. Date: Mar. 8, 2012

(65) Prior Publication Data
US 2012/0041995 A1 Feb. 16, 2012

(51) Int. Cl.
*G06F 17/17* (2006.01)

(52) U.S. Cl.
USPC .......................................................... 708/313

(58) Field of Classification Search
CPC .......... H03H 17/0664; H03H 17/0657; H03H 17/0671; H03H 17/0685; G06F 17/17
USPC .......................................................... 708/313
See application file for complete search history.

(56) References Cited

U.S. PATENT DOCUMENTS

| 4,725,972 A | * | 2/1988 | Gockler | ............ 708/313 |
| 5,274,372 A | | 12/1993 | Luthra et al. | |
| 6,125,155 A | * | 9/2000 | Lesthievent et al. | ............ 708/313 |

FOREIGN PATENT DOCUMENTS

EP 1134892 A1 9/2001

OTHER PUBLICATIONS

Bi, G. et al. "Reational Sampling Rate Conversion Structures with Minimum Delay Requirements." IEE Proceedings—E, vol. 139, No. 6, Nov. 1992.
Groth, A. et al. "Block-Processing Approach to Fractional Sample Rate Conversion with Adjustable Timing." 7th International Workshop on Digital Signal Processing Techniques for Space Communications, Sesimbra, Portugal, Oct. 1-3, 2001.
Hsiao, Chia-Chuan. "Polyphase Filter Matrix for Rational Sampling Rate Converters." International Conference on Acoustics, Speech and Signal Processing, Dallas, TX, US, Apr. 6-9, 1987.
Yim, W. H. et al. "Extended Polyphase Structures for Multirate DSP." IEE Proceedings—F, vol. 139, No. 4, Aug. 1992.

* cited by examiner

*Primary Examiner* — Tan V. Mai
(74) *Attorney, Agent, or Firm* — Coats and Bennett, P.L.L.C.

(57) ABSTRACT

The multi-branch rate change filter of the present invention achieves higher effective output rates by processing the input sample stream in two or more parallel filter branches with offset states.

18 Claims, 14 Drawing Sheets

MULTI-BRANCH RATE CHANGE FILTER

TECHNICAL FIELD

The present invention relates generally to polyphase rate change filters and, more particularly, to a polyphase rate change filter with multiple branches.

BACKGROUND

In digital hardware, it is possible to modify the sampling rate of a signal, for example from 400 MHz to 600 MHz, by implementing a digital filter called a polyphase finite-impulse response (FIR) rate change filter (RCF). In a polyphase FIR rate change filter, every output sample y(m) is generated by multiplying the input sample stream with a subset of the filter coefficients (also called phase), and by summing the resulting products. The upsampling and downsampling factors, denoted U and D respectively, are determined by the ratio of the filter input and output sample rates. In the example of a stream being rate changed from 400 MHz to 600 MHz, the U and D factors could be almost any combination of integers that produce a ratio of 1.50. In this example, the upsampling and downsampling factors could be: U=150 and D=100.

In advanced communication systems, very fast data rates are sometimes needed to implement a group of signal processing functions. However, these rates may be too fast to be realized in digital hardware using the existing technologies, such as Application Specific Integrated Circuits (ASICs) and Field Programmable Gate Arrays (FPGAs). Therefore, there is a need for new designs for rate change filters using existing technologies that can increase the effective processing speed for high data rate applications.

SUMMARY

The present involve relates to a rate change filter having multiple branches. The multi-branch rate change filter of the present invention achieves higher effective output rates by processing the input sample stream in two or more parallel filter branches with offset states and optionally combining the output samples from each branch.

Exemplary embodiments of the invention comprise methods for filtering an input sample stream having a first sample rate to generate an output sample stream having a second sample rate. In one exemplary embodiment, the method comprises inputting the sample stream to a rate change filter with two or more filter branches having offset states, and filtering the input sample stream in parallel filter branches with filter coefficients corresponding to different phases to generate a multiple output sample substreams.

Other exemplary embodiments of the invention comprise a rate change filter configured to filter an input sample stream having a first sample rate to generate an output sample stream having a second sample rate. In one embodiment of the invention, the rate change filter comprises two or more parallel filter branches with offset states to filter the input sample streams using filter coefficients corresponding to different phases and to generate multiple output substreams; and a control circuit to control input of the input sample stream to the filter branches and the selection of filter coefficients for the parallel filter branches.

DETAILED DESCRIPTION

Figure 1:
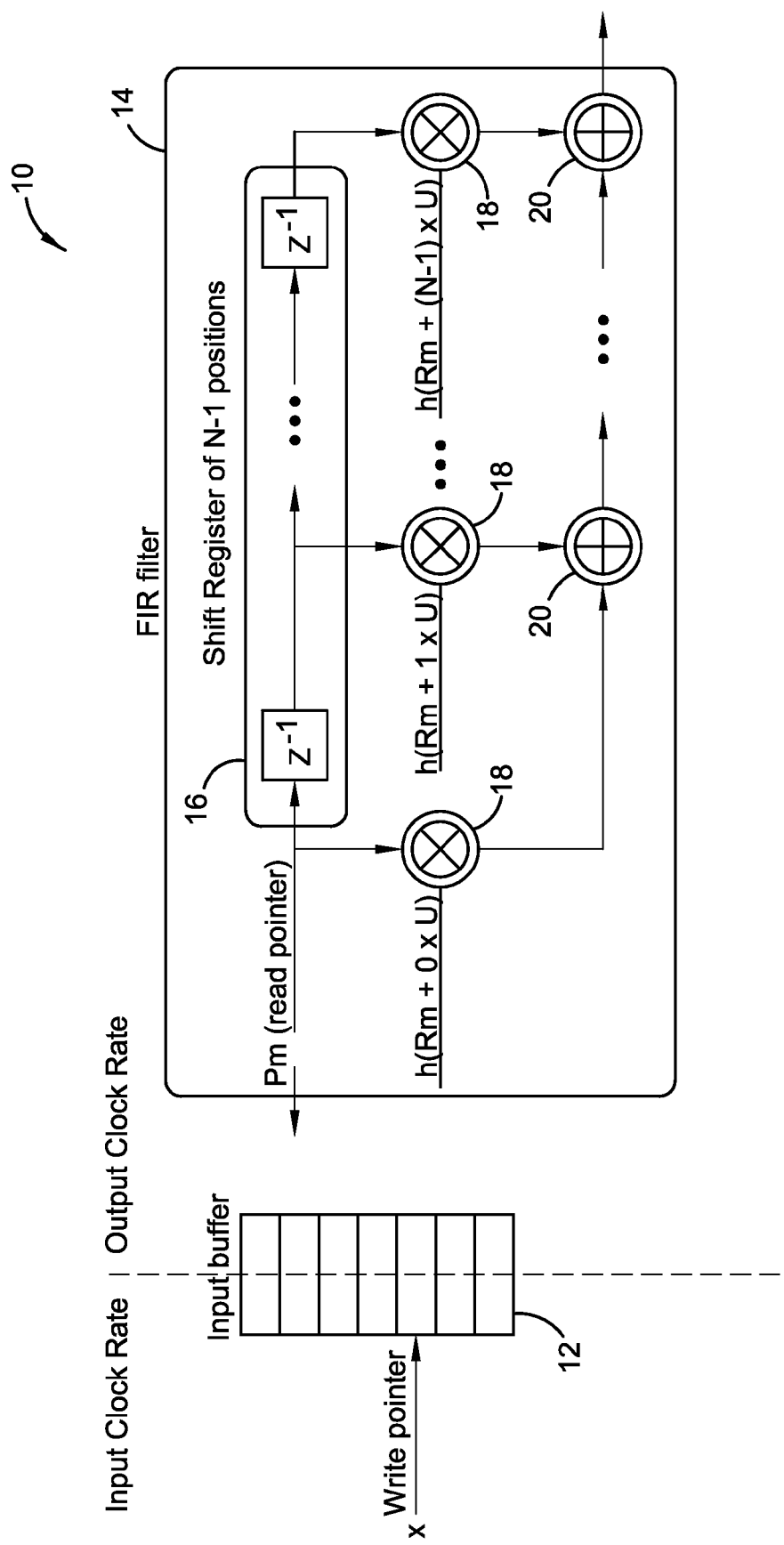
FIG. 1 illustrates an exemplary hardware implementation of a polyphase rate change filter.

Referring now to the drawings, FIG. 1 illustrates a typical hardware implementation of a polyphase rate change filter indicated generally by the numeral 10. The main functional components of the rate change filter 10 comprise an input sample buffer 12, and a finite impulse response (FIR) filter 14. The FIR filter 14 is implemented as a shift register 16 with N−1 positions. The shift register 16 implements a sliding window. The filter coefficients, applied by multipliers 18, are divided into subsets, which are sometimes referred to as phases. During every output clock cycle, the input samples selected by the sliding window are multiplied with the coefficients of a phase, and the resulting products are summed by adders 20 to generate the output sample.

The operation of the rate change filter 10 is given by the equation:

$$y(m) = \sum_{n=0}^{N-1} h\left(nU + mD - \left\lfloor \frac{mD}{U} \right\rfloor U\right) \times x\left(\left\lfloor \frac{mD}{U} \right\rfloor - n\right), \quad \text{Eq. 1}$$

$$m \in \left[0 : \left\lceil \frac{L_x \times U}{D} \right\rceil - 1\right]$$

where

N is the number of taps per phase, i.e. the number of coefficients per phase.

h is the filter impulse response x is the input sample stream y is the output sample stream U is the upsampling factor D is the downsampling factor m is the output sample stream index n is the filter tap index $\lfloor \alpha \rfloor$ is the rounding function towards minus infinity, i.e. the floor function.

$\lfloor \alpha \rfloor$ is the rounding function towards plus infinity, i.e. the cell function.

$L_x$ is the length of the input sample stream x.

The upsampling and downsampling factors, U and D, are determined by the ratio of the filter input and output sample rates. In the example of a input sample stream being converted from 400 MHz to 600 MHz, the U and D factors could be almost any combinations of integers that produce a ratio of 1.50. In this example, the up and down factors could be: U=150 and D=100. The length of the filter impulse response is determined by the upsampling factor U and the number of filter taps N. One constraint on the design of the rate change filter 10 is the selection of the upsampling factor U so that the rate change filter 10 has a sufficient number of coefficients to provide good performance.

Equation 1 can be rewritten as:

$$y(m) = \sum_{n=0}^{N-1} h(nU + R_m) \times x(P_m - n), m \in \left[0 : \left\lceil \frac{L_x \times U}{D} \right\rceil - 1 \right] \quad \text{Eq. 2}$$

where $$R_m = mD - \left\lfloor \frac{mD}{U} \right\rfloor U = (mD) \bmod U \quad \text{Eq. 3}$$

$$P_m = \left\lfloor \frac{mD}{U} \right\rfloor. \quad \text{Eq. 4}$$

The term $P_m$ functions as a read pointer and the term $R_m$ functions as a phase offset as hereinafter described.

As the m index (the output sample stream index) is incremented from one cycle to another, the value of the phase offset $R_m$ is either incremented by D, or incremented by D and decreased by a multiple of U, by definition of the modulo function. The multiple of U is determined by the expression $\lfloor mD/U \rfloor$. For implementations where the ratio U/D is greater than one, the D factor will always be smaller than the U factor. With this constraint, the term $\lfloor mD/U \rfloor$ will either remain constant, or will be incremented by one, from one output clock cycle to another in order to perform the modulo function with respect to U.

Figure 2:
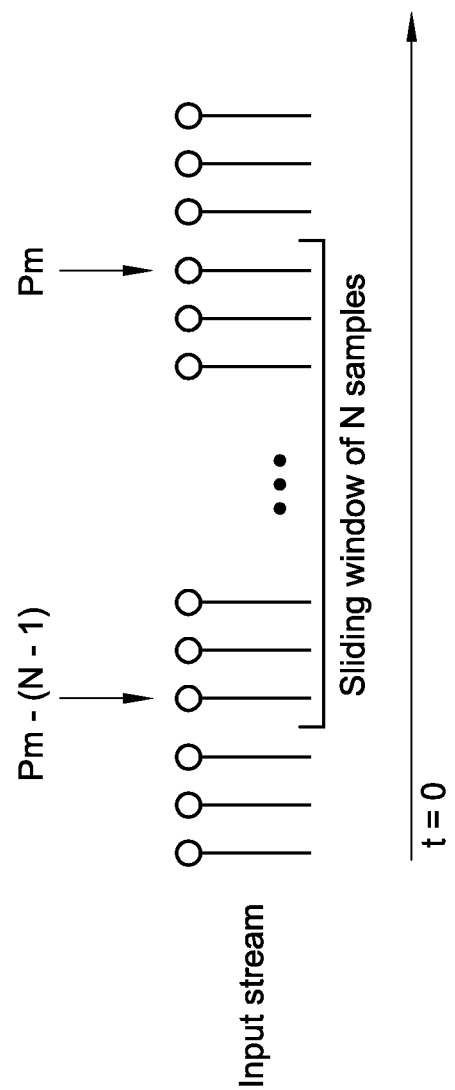
FIG. 2 illustrates the input sample selection for a polyphase rate change filter.
Figure 3:
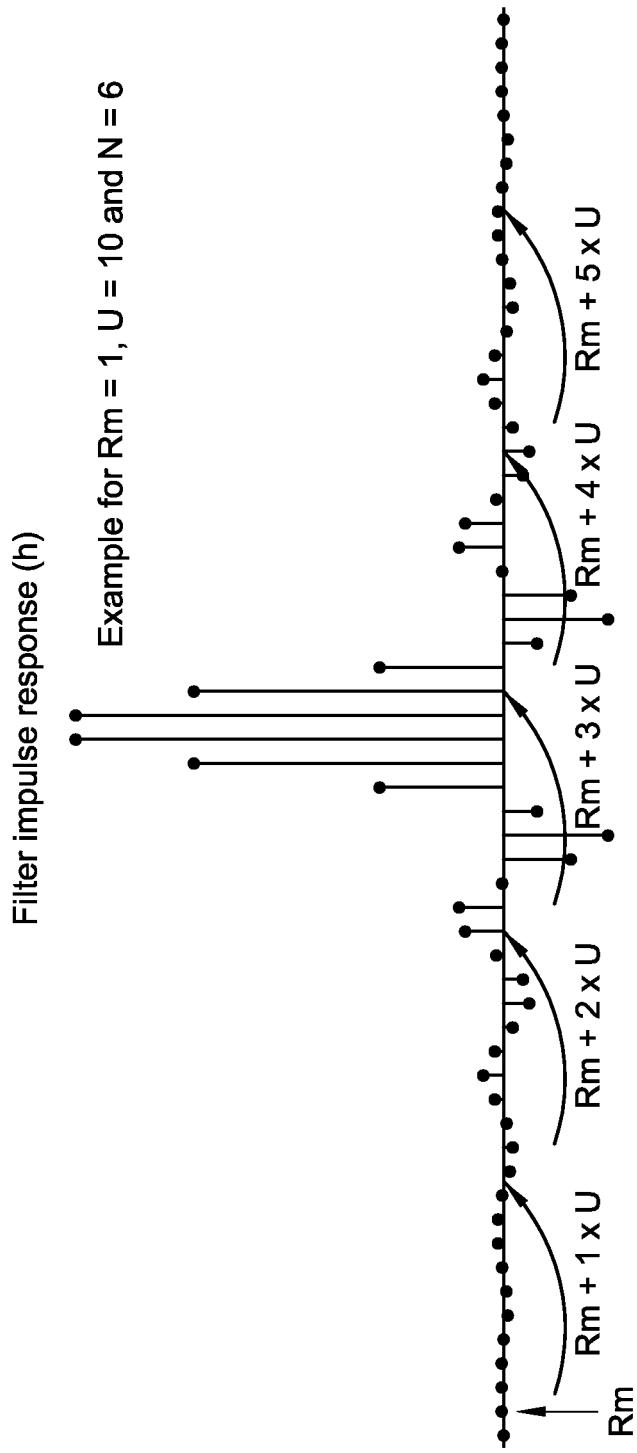
FIG. 3 illustrates the coefficient selection for a polyphase rate change filter.

Conceptually, the input sample stream is scanned by a sliding window of N samples, given by the term $$\sum_{n=0}^{N-1} \ldots x(P_m - n)$$

in Equation 2, which is implemented by the shift register 16, as shown in FIG. 2. The starting point of the sliding window is determined by the read pointer $P_m$ (given in Equation 4). The coefficients for each phase are selected accordingly to the expression $$\sum_{n=0}^{N-1} h(nU + R_m)$$

in Equation 2, which is dependent on the phase offset $R_m$ (given in Equation 3). Thus, output sample 0 is generated using the coefficients of phase 0, output sample 1 is generated using the coefficients of phase 1, and so on until the maximum number of phases is reached, which corresponds to the upsampling factor U. The phase selection process then restarts at phase 0, so that the Uth output sample is generated using the coefficients of phase 0. FIG. 3 illustrates the coefficients selection process for one phase. Because the filter coefficients change on each output clock cycle, the coefficients associated with a given phase will be used once every U output clock cycles in the single branch rate change filter 10.

A detailed mathematical description of polyphase multirate filters can be found in chapter 11 of John. G. Proakis and Dimitris G. Manolakis, *Digital Signal Processing: Principles, Algorithms, and Applications,* 4th edition, Prentice Hall, 2006.

Figure 4:
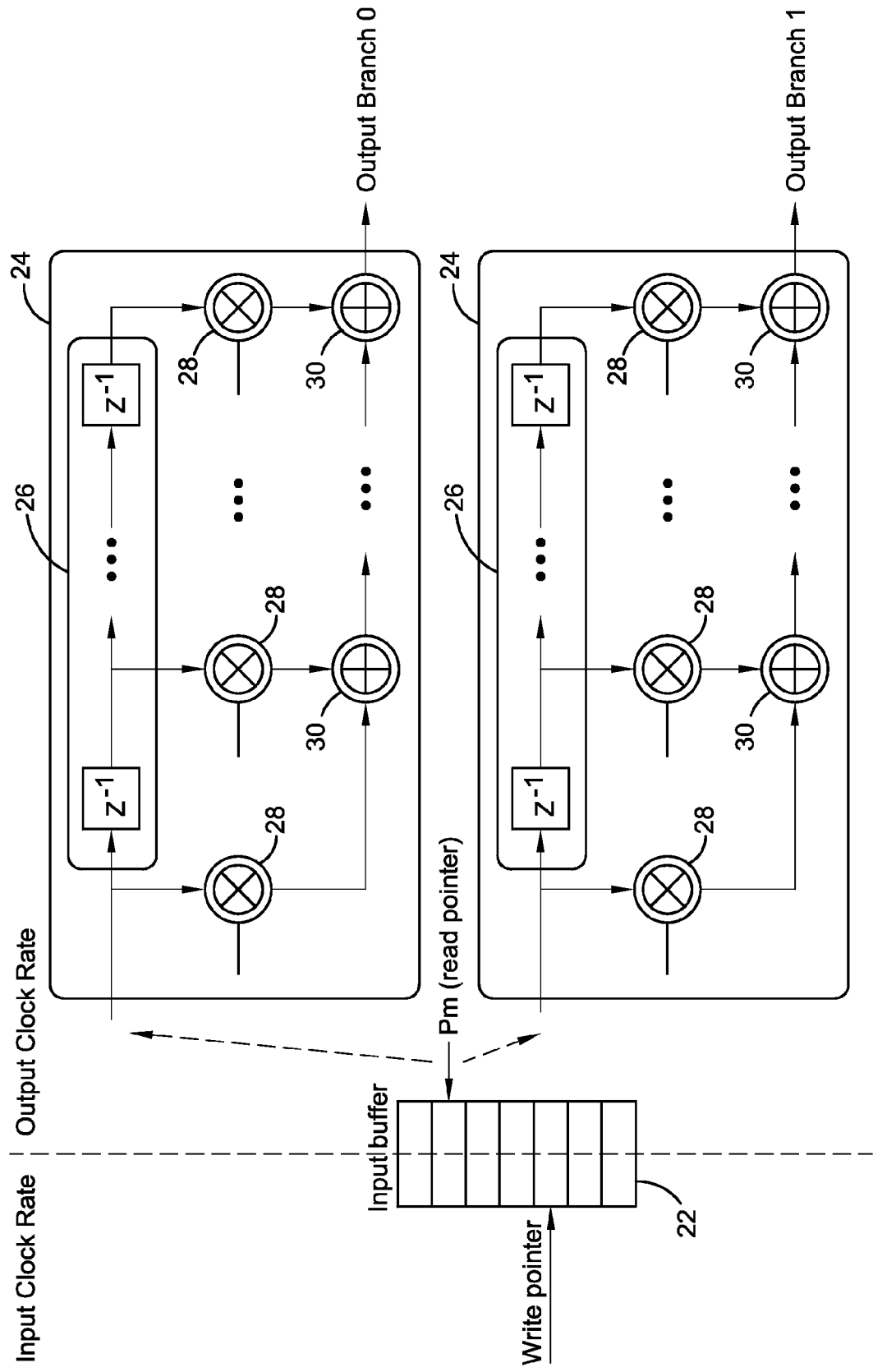
FIG. 4 illustrates an exemplary hardware implementation of a multi-branch polyphase rate change filter.

When the sample rate of the input sample stream is increased by the rate change filter 10, the output rate may be too fast to realize with existing technologies using conventional designs for rate change filters. According to various embodiments of the present invention, higher effective output rates can be achieved by processing the input sample stream in a multi-branch rate change filter 20 with two or more parallel branches as conceptually shown in FIG. 4. The multi-branch rate change filter 20 comprises at least one input buffer 22 and two or more parallel filter branches 24. Each filter branch 24 includes a shift register 26, multiplier 28, and adder 30, which operate as a FIR filter. In the multi-branch rate change filter 20, the input sample stream is fed to each branch 24, which filter the input sample stream to generate output substreams. During each output clock cycle, one output sample is generated by each branch 24. Therefore, M output samples are generated in a rate change filter with M branches 24. Each branch 24 applies a different set of filter coefficients, which change from one output clock cycle to another. The output substreams may then be combined by a parallel-to-serial converter or other combiner to generate the final output sample stream. The effective output rate is equal to the maximum rate of each branch times the number of branches 24. The challenge in this architecture is to jointly manage the individual branches 24 of the rate change filter 20.

Control logic (not shown in FIG. 4) for the rate change filter 20 includes three main components. The first component of the control logic comprises state machines 40 (FIGS. 7-11) to manage the read pointers $P_{mx}$ and phase offsets $R_{mx}$ (referred to collectively as state variables) for each branch 24. The second component of the control logic comprises input control logic 52 (FIG. 12) to manage the input sample stream. The third component of the control logic comprises coefficient control logic 66 (FIGS. 14 and 15) to manage the distribution of filter coefficients to the different branches 24 of the rate change filter 20. The control logic may be implemented by a control circuit comprising a processor, logic circuit, or a combination thereof. The components of the control logic are elaborated in more detail below. For simplicity, a two branch rate change filter 20 is described in detail. The principles elaborated can be easily extended to a rate change filter 20 with three or more branches 24.

Implementation Algorithm

In a two-branch rate change filter 20, two output samples are generated every output clock cycle. In the following description, the branches 24 are referred to herein individually as Branch 0 and Branch 1. Branch 0 produces the even output samples and Branch 1 produces the odd output samples. By definition of odd and even numbers, the output of Branch (y0) and the output of Branch 1 (y1) can be written as:

$$y0(k) = y(2k), \quad \text{Eq. 5}$$

$$y1(k) = y(2k+1), k \in \left[0 : \frac{\left\lceil \frac{L_x \times U}{D} \right\rceil}{2} - 1\right] \quad \text{Eq. 6}$$

The variable k in Equations 5 and 6 is the output stream index of each branch 24. By substituting the variable m in Equation 1 by its odd and even representations, the instantaneous output vector of the proposed dual-branch rate change filter 20 can be written as:

$$[y(2k), y(2k+1)], k \in \left[0 : \frac{\left\lceil \frac{L_x \times U}{D} \right\rceil}{2} - 1\right]. \quad \text{Eq. 7}$$

where $$y(2k) = \sum_{n=0}^{N-1} h\left(nU + (2k)D - \left\lfloor \frac{(2k)D}{U} \right\rfloor U\right) \times x\left(\left\lfloor \frac{(2k)D}{U} \right\rfloor - n\right) \quad \text{Eq. 8}$$

and $$y(2k+1) = \quad \text{Eq. 9}$$

$$\sum_{n=0}^{N-1} h\left(nU + (2k+1)D - \left\lfloor \frac{(2k+1)D}{U} \right\rfloor U\right) \times x\left(\left\lfloor \frac{(2k+1)D}{U} \right\rfloor - n\right)$$

Comparing Equations 1 and 7, it may be noted that the number of cycles required to process the input sample stream in the dual branch rate change filter 20 is half the number of cycles required by a single branch rate change filter 10. For practical purposes, the input sample stream must have an even number of input samples. In cases where the input sample stream contains an odd number of samples, an extra zero may be appended to the sample stream for the last sample of Branch 1.

In order to implement Equations 8 and 9 in hardware, two state machines denoted as Sm0 and Sm1, operate in parallel. There is an offset of one state between Sm0 and Sm1. More particularly, the state of Sm0 is given by the expression 2k and the state of Sm1 is given by the expression 2k+1. During every output clock cycle, the state of Sm0 and Sm1 are incremented by two states. State machine Sm0 controls Branch 0 and tracks the state variables $R_{m0}$ and $P_{m0}$. From Equations 3, 4, and 8, the value of $R_{m0}$ and $P_{m0}$ are given by:

$$R_{m0} = (2 \times k) \times D - \left\lfloor \frac{(2 \times k) \times D}{U} \right\rfloor U \quad \text{Eq. 10}$$

$$P_{m0} = \left\lfloor \frac{(2 \times k) \times D}{U} \right\rfloor \quad \text{Eq. 11}$$

State machine Sm1 controls Branch 1 and tracks the state variables $R_{m1}$ and $P_{m1}$. From Equations 3, 4, and 9, the values of $R_{m1}$ and $P_{m0}$ are given by:

$$R_{m1} = (2 \times k + 1) \times D - \left\lfloor \frac{(2 \times k + 1) \times D}{U} \right\rfloor U \quad \text{Eq. 12}$$

$$P_{m1} = \left\lfloor \frac{(2 \times k + 1) \times D}{U} \right\rfloor \quad \text{Eq. 13}$$

Combining Equations 7-12, Equations 7-9 can be rewritten as:

$$[y0(k), y1(k)], k \in \left[0 : \frac{\left\lceil \frac{L_x \times U}{D} \right\rceil}{2} - 1\right]. \quad \text{Eq. 14}$$

where $$y0(k) = \sum_{n=0}^{N-1} h(nU + R_{m0}) \times x(P_{m0} - n) \quad \text{Eq. 15}$$

and $$y1(k) = \sum_{n=0}^{N-1} h(nU + R_{m1}) \times x(P_{m1} - n) \quad \text{Eq. 16}$$

Figure 5:
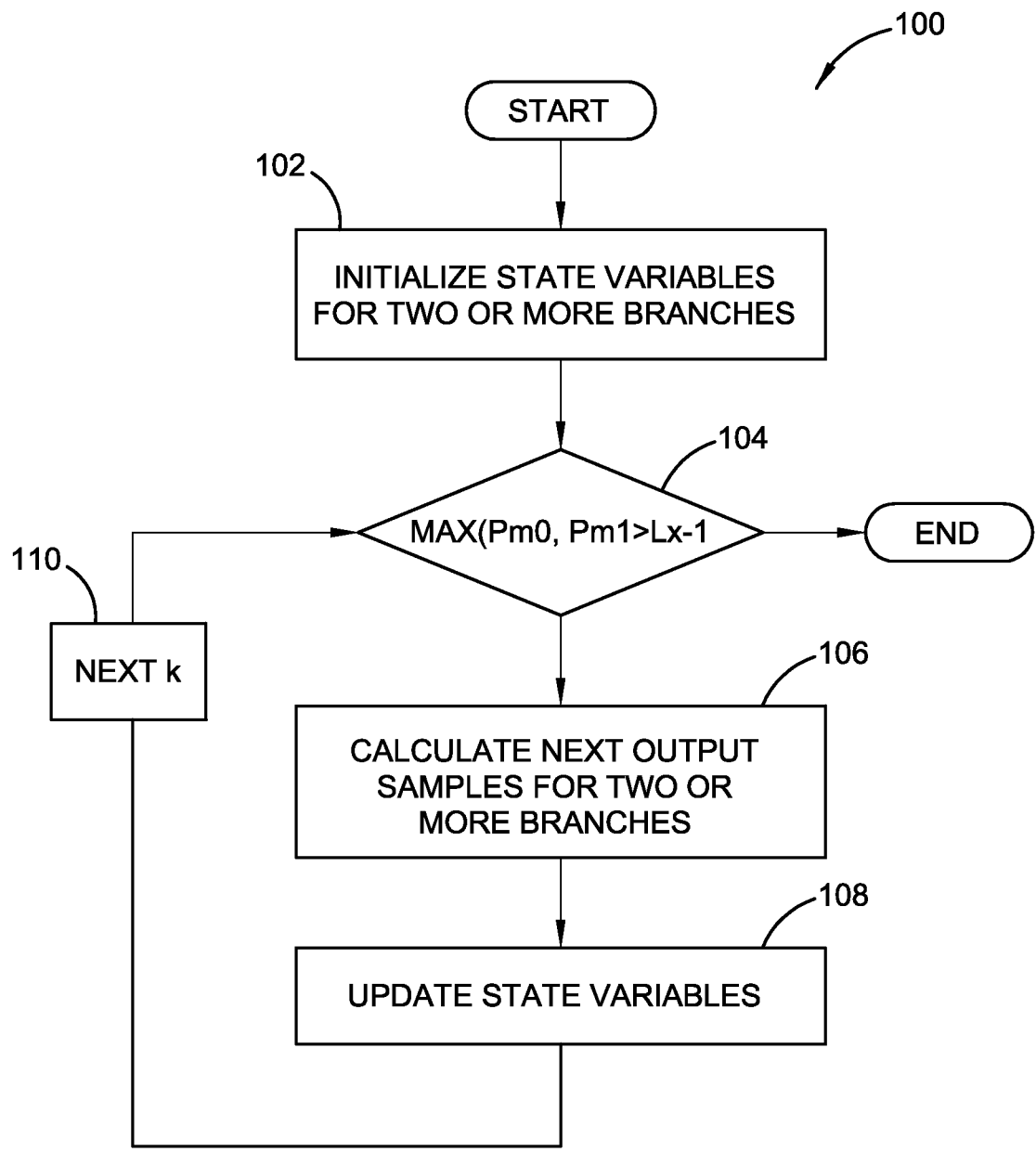
FIG. 5 illustrates an exemplary method of filtering an input sample stream in a multi-branch polyphase rate change filter.

FIG. 5 illustrates a generic method 100 implemented by a multi-branch rate change filter 20. To start, state machines Sm0 and Sm1 for Branch 0 and Branch 1 respectively of the rate change filter 20 are initialized (block 102). Table 1 below lists the variables used by the sate machines Sm0 and Sm1 and the initial values of the variables.

TABLE 1

| Initialization of State Machine | |
|---|---|
| Variable | Initial Value |
| k | 0 |
| $L_x$ | Length of input sample stream |
| D | Downsampling factor |
| U | Upsampling factor |
| $R_{m0}$ | 0 |
| $R_{m1}$ | $(R_{m0} + D) \bmod U$ |
| $P_{m0}$ | 0 |
| $P_{m1}$ | $P_{m0} + \text{int}(D/U)$ |

The values of $L_x$, D, and U are constants. In the case where U>D, the initial value of $R_{m1}$ simplifies to $R_{m0}+D$ and the initial value of $P_{m1}$ equals 0.

After the initialization of the state machines Sm0 and Sm1, the multi-branch rate change filter 20 is ready to process the input sample stream. For as long as the read pointers are below $L_x-1$ (block 104), the multi-branch rate change filter 20 calculates output samples (block 106), updates the state machine variables (block 108), and increments the per-branch output sample stream index (block 110) during each output clock cycle. In the two branch rate change filter 20, two output samples are calculated during each output clock cycle. The output samples are computed according to Equations 15 and 16 respectively. The state machines increment the phase offsets $R_{m0}$ and $R_{m1}$ and the read pointers $P_{m0}$ and $P_{m1}$ for Branch 0 and Branch 1 during each clock cycle according to Equations 10-13.

Figure 6:
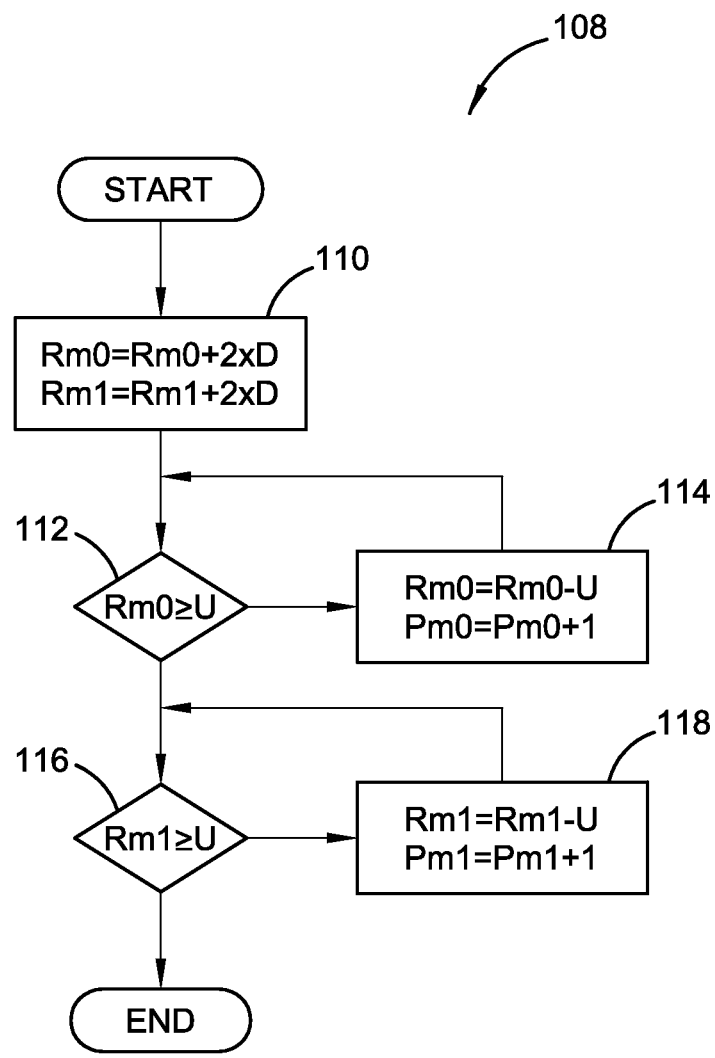
FIG. 6 illustrates a first exemplary method for updating state variables in a multi-branch polyphase rate change filter.

FIG. 6 illustrates an exemplary method for updating the state variables in block 108 of FIG. 6. More particularly, state machine Sm0 starts by incrementing $R_{m0}$ by 2×D (block 110). Then, for as long as $R_{m0}$ is greater than or equal to U (block 112), the state machine Sm0 subtracts U from $R_{m0}$ and increments the read pointer $P_{m0}$ each time U is subtracted (block 114). Similarly, state machine Sm1 starts by incrementing $R_{m1}$ by 2×D (block 110). Then, for as long as $R_{m1}$ is greater than or equal to U (block 116), the state machine Sm1 subtracts U from $R_{m1}$ and increments the read pointer $P_{m1}$ each time U is subtracted (block 118).

In the situation where two branches 24 do not provide enough processing speed given the hardware operating frequency, a designer can choose to implement the polyphase FIR rate change filter 20 using M branches 24. Note that the value of M can be larger than the total number of phases. In this alternative embodiment, M output samples are generated every output clock cycle. Branch 0 produces every M output samples with an offset of 0, Branch 1 produces the every M output samples with an offset of 1, and so on. The output of the different branches 24 can be written as:

$$y_0(\beta) = y(M\beta),$$ Eq. 17

$$y_1(\beta) = y(M\beta + 1),$$

$$\ldots,$$

$$y_{M-1}(\beta) = y(M\beta + (M-1)), \beta \in \left[0 : \frac{\left\lceil \frac{L_x \times U}{B} \right\rceil}{M} - 1\right]$$

The instantaneous output vector of the multiple-branch polyphase FIR rate change filter can be written as:

$$[y(M\beta), y(M\beta + 1), \ldots,$$ Eq. 18

$$y(M\beta + (M-1))] = \left[\sum_{n=0}^{N-1} h\left(nU + (M\beta)D - \left\lfloor \frac{(M\beta)D}{U} \right\rfloor U\right) \times x\left(\left\lfloor \frac{(M\beta)D}{U} \right\rfloor - n\right),\right.$$

$$\sum_{n=0}^{N-1} h\left(nU + (M\beta + 1)D - \left\lfloor \frac{(M\beta + 1)D}{U} \right\rfloor U\right) \times x\left(\left\lfloor \frac{(M\beta + 1)D}{U} \right\rfloor - n\right), \ldots,$$

$$\sum_{n=0}^{N-1} h\left(nU + (M\beta + (M-1))D - \left\lfloor \frac{(M\beta + (M-1))D}{U} \right\rfloor U\right) \times$$

$$\left. x\left(\left\lfloor \frac{(M\beta + (M-1))D}{U} \right\rfloor - n\right)\right], \beta \in \left[0 : \frac{\left\lceil \frac{L_x \times U}{D} \right\rceil}{M} - 1\right].$$

In case the term $$\frac{\left\lceil \frac{L_x \times U}{C} \right\rceil}{M}$$

in Equation 18 is not an integer, some extra zeros will be padded in hardware for the last sample of the last $$M - \left(\left\lceil \frac{L_x \times U}{D} \right\rceil - \left\lfloor \frac{\left\lceil \frac{L_x \times U}{D} \right\rceil}{M} \right\rfloor M\right)$$

branches 24. The implementation details of the dual-branch rate change filter as described herein can be easily extended to rate change filters with three or more branches 24.

State Machine Implementation

One constraint on implementing the state machines Sm0 and Sm1 in hardware is that the state machines have to complete their operations within one clock cycle. This constraint means that the while statements in FIG. 6 (i.e., blocks 112 and 116) have to be executed in one clock cycle. The present invention is intended to be used for U/D ratios greater than one. In this case the upsampling factor U will always be greater than the downsampling factor D. With this constraint, the while statements of FIG. 6 can be replaced by if statements, so that no iterations are required to maintain the phase offset values $R_{m0}$ and $R_{m1}$ below the value of the upsampling factor U.

For hardware implementations, two situations have to be considered:

The U/D ratio of the rate change filter 20 is in the range of [1.0; 2.0].

The U/D ratio of the rate change filter 20 is greater than 2.

In the situation where the U/D ratio of the rate change filter is in the range of [1.0; 2.0], the values of the phase offsets $R_{m0}$ and $R_{m1}$ are either incremented by 2×D, or incremented by 2×D and decreased by a multiple of U as k index is incremented from one cycle to another. The value of the multiple of U is determined by the expression:

$$\left\lfloor \frac{(2 \times k + l) \times D}{U} \right\rfloor$$ Eq. 19 where l represents the branch index. By analyzing Equation 19 for the two corner cases (U/D=1 and U/D=2), the following relationships are obtained:

$$U/D = 1 \Rightarrow \left\lfloor \frac{(2 \times k + l) \times D}{U} \right\rfloor = \left\lfloor \frac{(2 \times k + l) \times U}{U} \right\rfloor = 2 \times k + l$$ Eq. 20

$$U/D = 2 \Rightarrow \left\lfloor \frac{(2 \times k + l) \times D}{U} \right\rfloor = \left\lfloor \frac{(2 \times k + l) \times \frac{U}{2}}{U} \right\rfloor = \left\lfloor k + \frac{l}{2} \right\rfloor = k$$ Eq. 21

Based on the above corner cases analysis, for U/D rates in the range of [1.0; 2.0], from one cycle to another (as k is incremented) either one times U or two times U will have to be subtracted from the phase offset $R_{mx}$ in order to implement the modulo function with respect to U. In Equation 20, the term l simply represents the initial offset of the different branches 24.

The inequality in the IF statement can be written as:

```
IF ( (R_mx + 2 × D ≥ 2 × U) ≡ (R_mx ≥ 2 (U− D)) )
    R_mx = R_mx + 2 × D − 2 × U = R_mx − 2 (U − D)
    P_mx = P_mx + 2
ELSE IF (R_mx + 2 × D ≥ U)
    R_mx = R_mx + 2 × D − U
    P_mx = P_mx + 1
END
```

Every time U quantity is subtracted from phase offset $R_{mx}$, the value of the corresponding read pointer $P_{mx}$ has to be incremented by one, which is why $P_{mx}$ is incremented by two in the first condition of the above IF statement.

For U/D ratios greater than 2.0, the upsampling factor U becomes larger than two times the downsampling factor D so that the subtraction by U is not always necessary. The following relationship is intuitively obtained from Equation 21:

$$U/D > 2 \Rightarrow \left\lfloor \frac{(2 \times k + l) \times D}{U} \right\rfloor < \left\lfloor \frac{(2 \times k + l) \times \frac{U}{2}}{U} \right\rfloor \Rightarrow$$ Eq. 22

-continued $$\left\lfloor \frac{(2 \times k + l) \times D}{U} \right\rfloor < k$$

For these ratios, the inequality in the IF statement can be derived from Equations 21 and 22 as follows:

```
IF ( (R_mx + 2 × D ≥ U) ≡ (R_mx ≥ U − 2 × D) )
    R_mx = R_mx + 2 × D − U = R_mx − (U − 2 × D)
    P_mx = P_mx + 1
ELSE IF (R_mx + 2 × D < U)
    R_mx = R_mx + 2 × D
    P_mx = P_mx + 0
END
```

Figure 7:
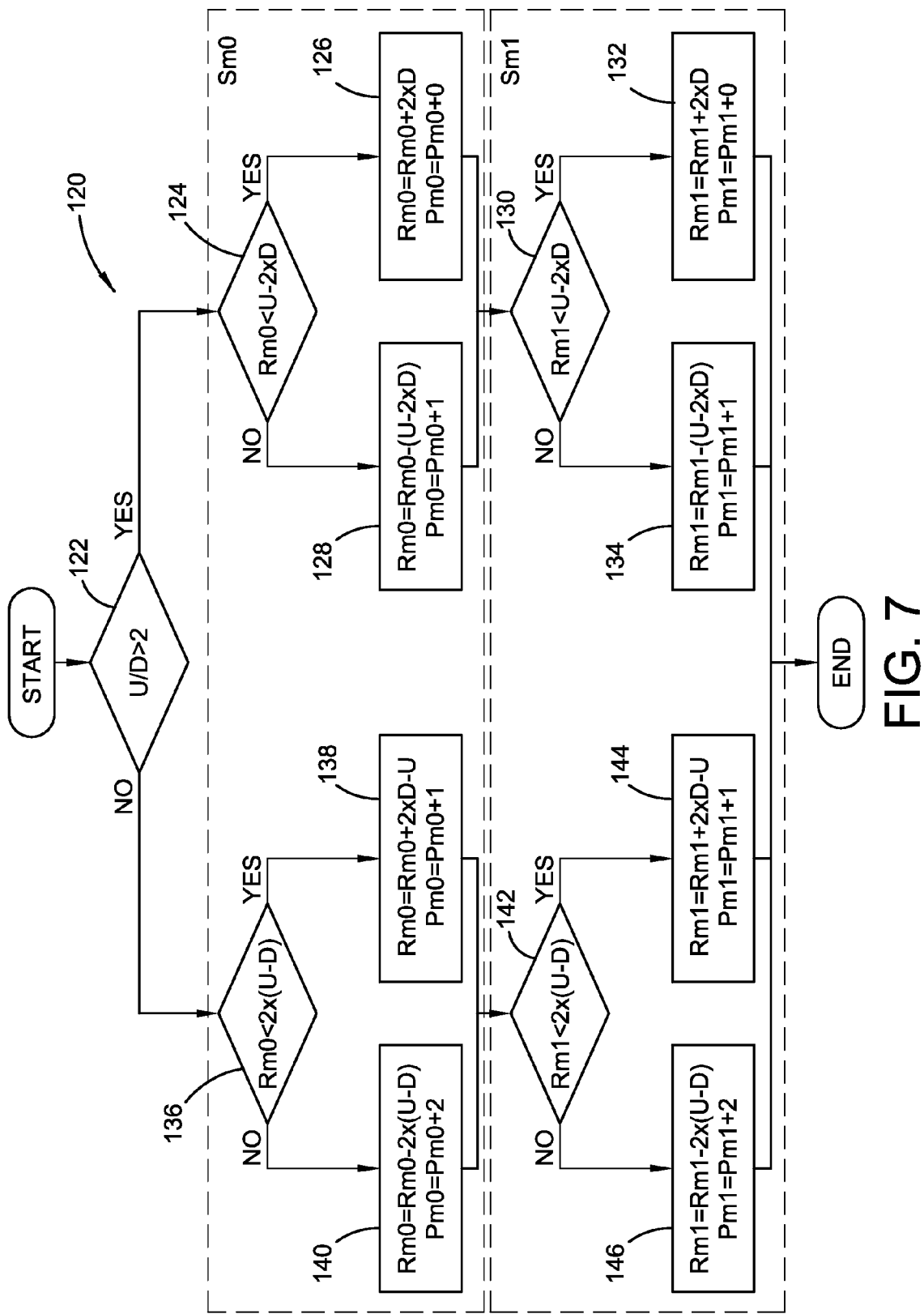
FIG. 7 illustrates a second exemplary method for updating state variables in a multi-branch polyphase rate change filter.

FIG. 7 illustrates an alternative method 120 for updating the state variables in a rate change filter 20 with two branches 24 in cases where the U/D ratio is greater than one. To start, the state machines Sm0 and Sm1 determine whether the ratio U/D is greater than two (block 122). If so, the process proceeds along the right branch in FIG. 7. The state machines Sm0 and Sm1 compare the phase offsets $R_{m0}$ and $R_{m1}$ to the threshold U−2×D, which is determined by the upsampling and downsampling factors (block 124 and 130). If $R_{m0}$ is less than U−2×D, the state machine Sm0 increments $R_{m0}$ by 2×D and leaves the read pointer $P_{m0}$ unchanged (block 126). If $R_{m0}$ is greater than of equal to U−2×D, the state machine Sm0 resets $R_{m0}$ equal to $R_{m0}$−(U−2×D) and increments the read pointer $P_{m0}$ by one (block 128). Similarly, if $R_{m1}$ is less than U−2×D, the state machine Sm1 increments $R_{m1}$ by 2×D and leaves the read pointer $P_{m1}$ unchanged (block 132). If $R_{m1}$ is greater than of equal to U−2×D, the state machine Sm1 resets $R_{m0}$ equal to $R_{m1}$−(U−2×D) and increments the read pointer $P_{m1}$ by one (block 134).

In cases where the ratio U/D is less than or equal to two, the process follows along the left branch of FIG. 7. The state machines Sm0 and Sm1 compare the phase offsets $R_{m0}$ and $R_{m1}$ to the threshold 2×(U−D), which is determined by the upsampling and downsampling factors (block 136 and 142). If $R_{m0}$ is less than 2×(U−D), state machine Sm0 increments $R_{m0}$ by 2×D−U and increments $P_{m0}$ by one (block 138). If $R_{m0}$ is greater than or equal to 2×(U−D), state machine Sm0 resets $R_{m0}$ equal to $R_{m0}$−2×(U−D) and increments $P_{m0}$ by two (block 140). Similarly, if $R_{m1}$ is less than 2×(U−D), state machine Sm1 increments $R_{m1}$ by 2×D−U and increments $P_{m1}$ by one (block 144). If $R_{m1}$ is greater than or equal to 2×(U−D), state machine Sm1 resets $R_{m1}$ equal to $R_{m1}$−2×(U−D) and increments $P_{m1}$ by two (block 146).

Figure 8:
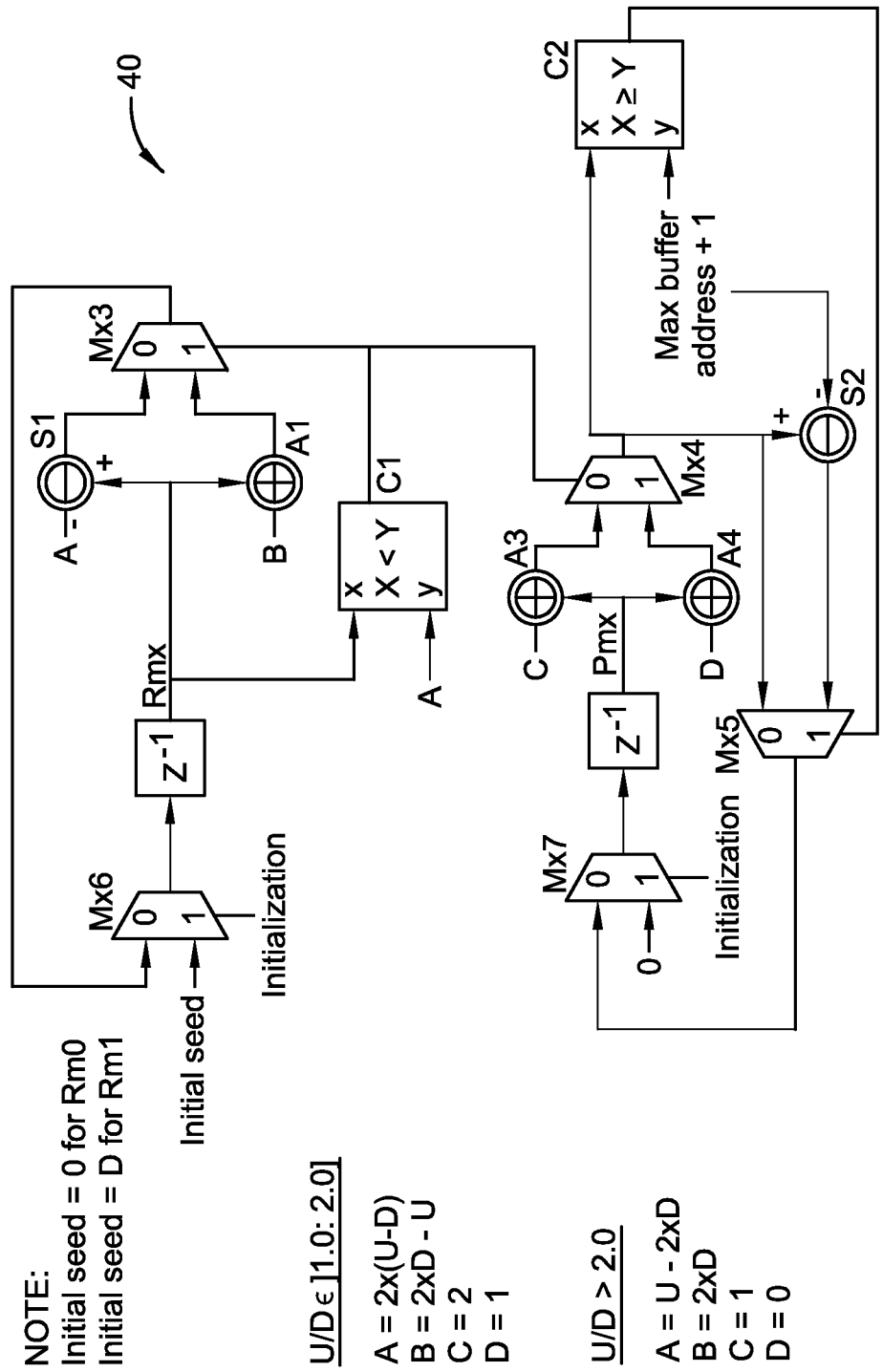
FIG. 8 illustrates an exemplary hardware implementation of a state machine for updating state variables in a multi-branch polyphase rate change filter.

FIG. 8 illustrates exemplary state machine, indicated generally by the numeral 40, in more detail. The state machine 40 for the case where U/D is in the range [1.0:2.0] is the same as the state machine 40 for the case where U/D is greater then two, except for the values of the constants A−D. The state machine 40 comprises a multiplexer Mx3 with an adder A1 and subtractor S1 connected to its inputs for computing the value of $R_{mx}$ and a multiplexer Mx4 with adders A3 and A4 connected to its inputs for computing the value of $P_{mx}$. A digital comparator C1 compares the value of $R_{mx}$ to a constant A and outputs a control signal to multiplexers Mx3 and Mx4 based on the comparison. When $R_{mx}$ is less than A, multiplexer Mx3 outputs the sum from adder A1, while multiplexer Mx4 outputs the sum from adder A4. When $R_{mx}$ is greater than or equal to A, multiplexer Mx3 outputs the difference from subtractor S1, while multiplexer Mx4 outputs the sum from adder A3. Multiplexer Mx5, comparator C2, and subtractor S2 are used to reset the read pointer when the maximum input buffer address is reached. Subtractor S2 subtracts the maximum buffer address plus 1 from the read pointer. When the value of $P_{mx}$ exceeds the maximum input buffer address, the comparator generates a control signal causing the multiplexer to output the difference computed by subtractor S2, thus wrapping the read point back to the starting address of the input buffer. Multiplexers Mx6 and Mx7 are used to initialize the state machine. The output of Mx6 is applied with a one cycle delay to adder A1, subtractor S1, and comparator C3. The output of Mx7 is applied with a one cycle delay to adders A3 and A4.

By breaking down the state machine operation into two steps, it is possible to derive another valid implementation for the state machines Sm0 and Sm1. The idea is to incorporate as a common factor the worst case of subtraction by U, so that the $R_{mx}$ values in the inequality are compared to zero. Using this approach, the inequality in the IF statement for ratios in the range of [1.0:2.0] can be written as:

```
Rmx = Rmx + 2 × D − 2 × U
IF ( (Rmx ≥ 0)
    Pmx = Pmx + 2
ELSE
    Rmx = Rmx + U
    Pmx = Pmx + 1
END
```

The same transformation is applied for U/D ratios greater than two. Note that this state machine is also able to complete all of its operations within one clock cycle. The only drawback is that the adders/subtractors have to handle negative values, so that they are bigger and slower in hardware.

Figure 9:
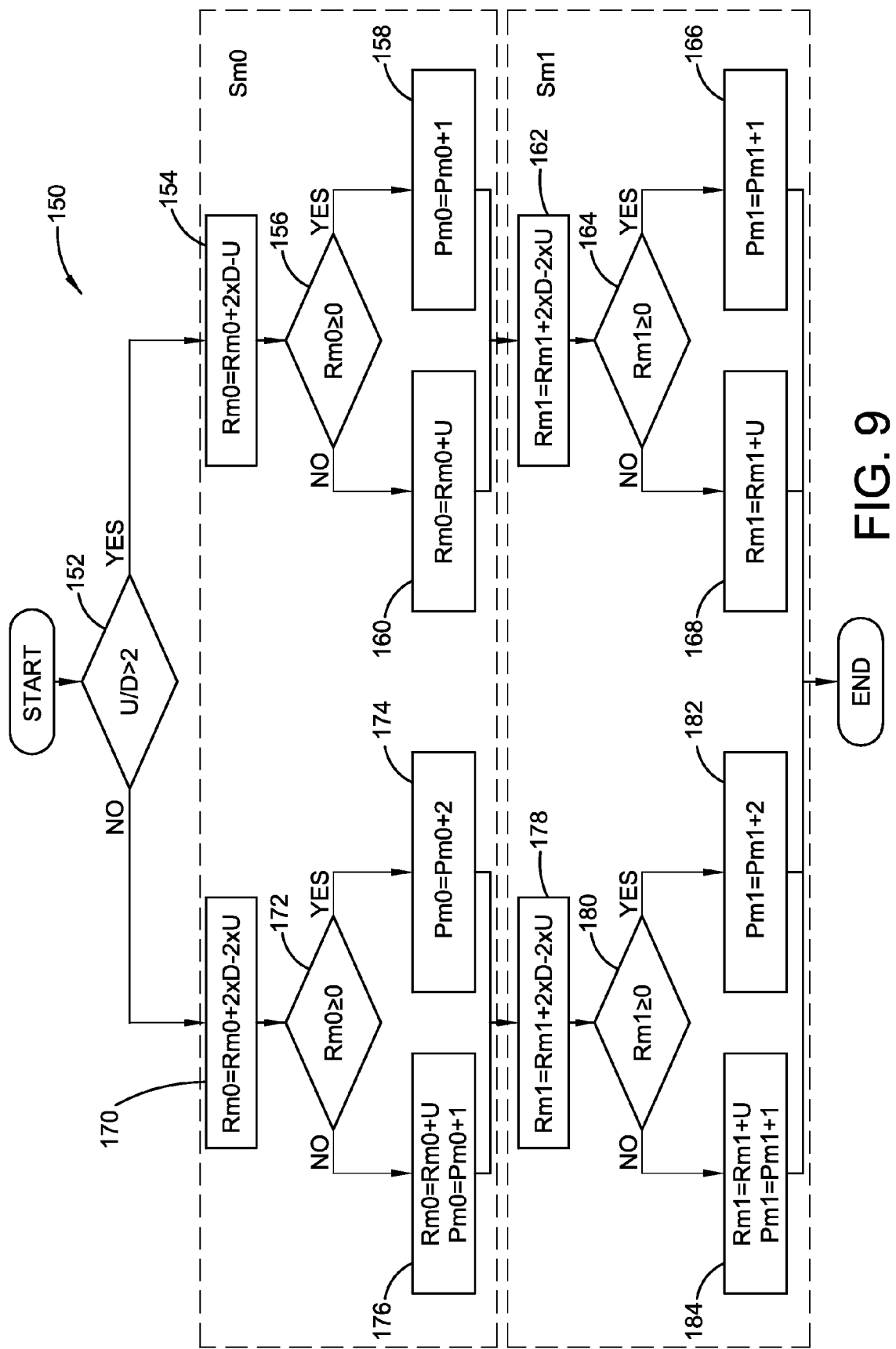
FIG. 9 illustrates a third exemplary method for updating state variables in a multi-branch polyphase rate change filter.

FIG. 9 shows an alternate method 50 of updating state variables for U/D ratios greater than one. The start the update process, the state machines Sm0 and Sm1 determine whether the ratio U/D is greater than two (block 152). If so, the process proceeds along the right branch in FIG. 9. State machine Sm0 increments the phase offset $R_{m0}$ by 2×D−U (block 154) and compares the result with zero (block 156). If the value of the new phase offset $R_{m0}$ is greater than or equal to zero, the state machine Sm0 increments the read pointer $P_{m0}$ by one (block 158). If the phase offset $R_{m0}$ is less than zero, the state machine increments $R_{m0}$ by U (block 160). Similarly, state machine Sm1 increments the phase offset $R_{m1}$ by 2×D−U (block 162) and compares the result with zero (block 164). If the value of the new phase offset $R_{m1}$ is greater than or equal to zero, the state machine Sm0 increments the read pointer $P_{m1}$ by one (block 166). If the phase offset $R_{m1}$ is less than zero, the state machine increments $R_{m1}$ by U (block 168).

In cases where the ratio U/D is less than or equal to two, the process follows along the left branch of FIG. 9. State machine Sm0 increments the phase offset $R_{m0}$ by 2×D−2U (block 170) and compares the result with zero (block 172). If the value of the new phase offset $R_{m0}$ is greater than or equal to zero, the state machine Sm0 increments and the read pointer $P_{m0}$ by two (block 174). If the phase offset $R_{m0}$ is less than zero, the state machine increments $R_{m0}$ by U and the read pointer $P_{m0}$ by one (block 176). Similarly, state machine Sm1 increments the phase offset $R_{m1}$ by 2×D−2×U (block 178) and compares the result with zero (block 180). If the value of the new phase offset $R_{m1}$ is greater than or equal to zero, the state machine Sm0 increments the read pointer $P_{m1}$ by two (block 182). If the phase offset $R_{m1}$ is less than zero, the state machine increments $R_{m1}$ by U and the read pointer $P_{m1}$ by one (block 184).

Figure 10:
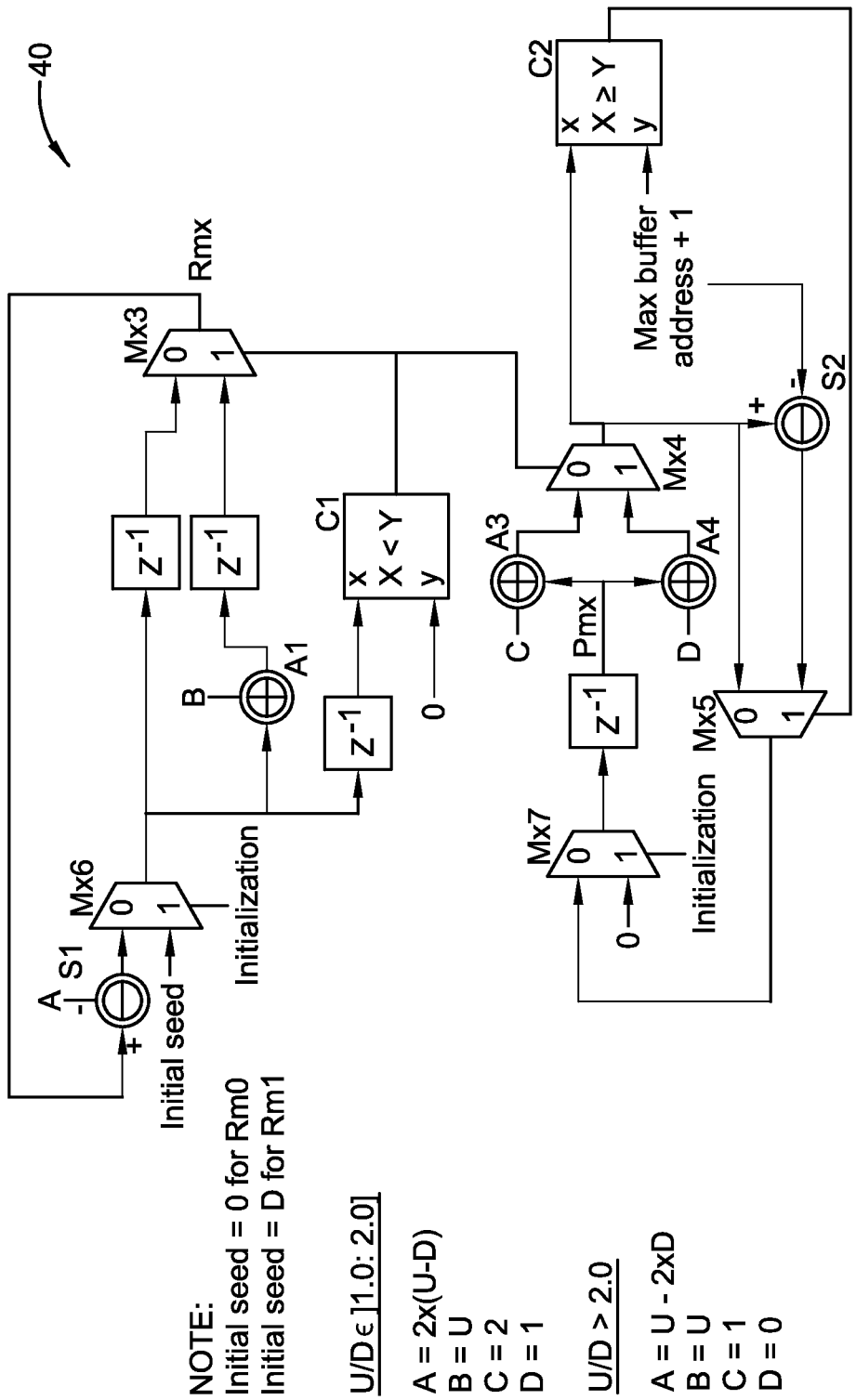
FIG. 10 illustrates an exemplary hardware implementation of a state machine for updating state variables in a multi-branch polyphase rate change filter.

The hardware implementation of the state machine 40 for this alternative embodiment is illustrated in FIG. 10. In this embodiment, adder A1 and subtractor S1 are connected to the inputs of multiplexer Mx3 with a one cycle delay for computing the value of $R_{mx}$. The output of S1 is connected to one input of multiplexer Mx6 to prevent A from being subtracted from the initial value of $R_{mx}$. Adders A3 and A4 connect to the inputs of multiplexer Mx4 for computing the value of $P_{mx}$ as previously described. Except for the initial cycle, the digital comparator C1 compares $R_{mx}-A$ to zero and outputs a control signal to multiplexers Mx3 and Mx4 based on the comparison. On the initial cycle, the comparator compares the initial seed to zero. When $R_{mx}-A$ (or the initial seed) is less than zero, multiplexer Mx3 outputs the sum from adder A1, while multiplexer Mx4 outputs the sum from adder A4. When $R_{mx}-A$ is greater than or equal to zero, multiplexer Mx3 outputs the difference from subtractor S1, while multiplexer Mx4 outputs the sum from adder A3. Multiplexer Mx5, comparator C2, and subtractor S2 are used to reset the read pointer $P_{mx}$ when the maximum input buffer address is reached as previously described. Subtractor S2 subtracts the maximum buffer address plus 1 from the read pointer $P_{mx}$. When the value of $P_{mx}$ exceeds the maximum input buffer address, the comparator C2 generates a control signal causing the multiplexer Mx5 to output the difference computed by subtractor S2, thus wrapping the read point back to the starting address of the input buffer. Multiplexers Mx6 and Mx7 are used to initialize the state machine. The output of Mx6 is applied with a one cycle delay to input 0 of Mx3 and to the x input of comparator C1, and without delay to the input of adder A1. The output of Mx7 is applied with a one cycle delay to adders A3 and A4.

Management of the Input Sample Stream

In order to distribute the input samples to the different branches 24 of the rate change filter 20, the input sample stream is written to two identical input buffers 22. The read pointer $P_{m0}$ reads the first input buffer and the pointer $P_{m1}$ reads the second input buffer. The read pointer $P_{m0}$ is primarily feeding the shift register 26 of Branch 0 and the read pointer $P_{m1}$ is primarily feeding the shift register of Branch 1. However, since the state machines Sm0 and Sm1 are incremented by two states every clock cycle (Rmx=Rmx+2×D), it is possible for a given read pointer $P_{mx}$ to be incremented by two addresses during one clock cycle (see, for example, block 146 in FIG. 7). In this situation, the samples in the shift register 26 are moved by two positions to the right, and the read pointer of the other branch is used to fill the sample gap, so that all the samples in the shift register 26 are consecutive. Filling the gap with samples from another input buffer is possible because the two state machines Sm0 and Sm1 have an offset of one state, so that if a sample is missing in one branch 24 because its primary read pointer has been incremented by two addresses, that sample can always be recovered from the other read pointer.

Figure 11:
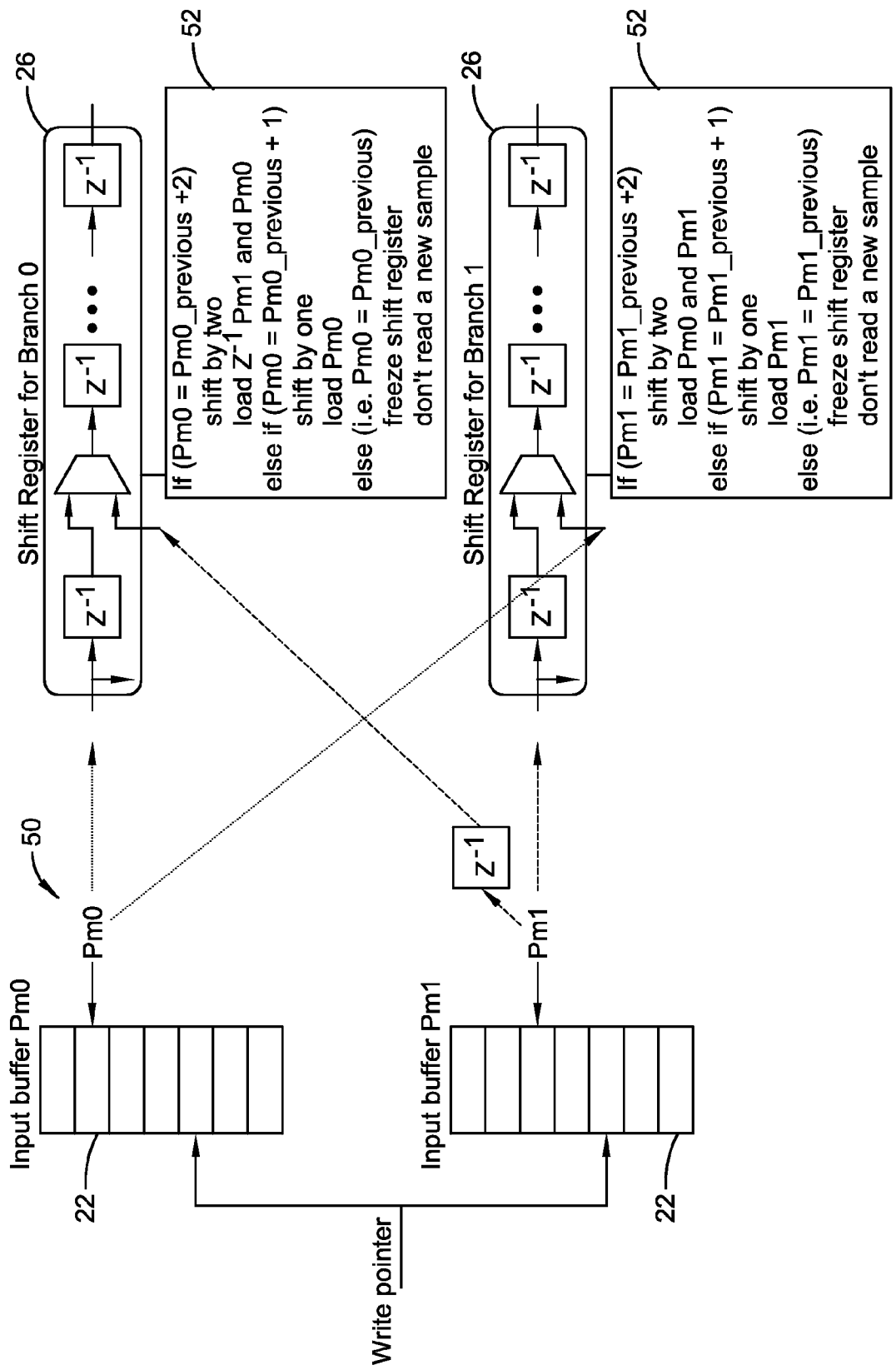
FIG. 11 illustrates management of the input sample stream in a multi-branch polyphase rate change filter.

FIG. 11 illustrates schematically an exemplary input circuit 50 for inputting samples to the shift registers 26 in the branches 24 of the rate change filter 20. As previously noted, input buffers 22 store the input sample stream. The read pointer $P_{m0}$ for Branch 0 primarily feeds the last register for Branch 0 and secondarily the second to last register for Branch 1, while the read pointer for Branch 1 primarily feeds the last register for Branch 1 and the second to last register of Branch 0 with a one cycle delay. Input control logic 52 controls the shifting of input samples from the input buffers 22 into the shift registers 26.

Because state machine Sm0 is advanced by one state compared to state machine Sm1, there is a delay of one clock cycle between the read pointer $P_{m1}$ and the shift register 26 of Branch 0. Another observation is that the samples read by Pm0 always go to the last position of the shift register in Branch 0. Whenever there is a shift by two samples, the sample provided by read pointer Pm1 is input to the second last position in the shift register 26 for Branch 0. The same process applies to Branch 1. Also, since the rate change filter 10 up/down ratios covered by this invention are always greater than one, it is guaranteed that the increments of the read pointers will always increment by 1, increment by 2, or remain unchanged.

Figure 12:
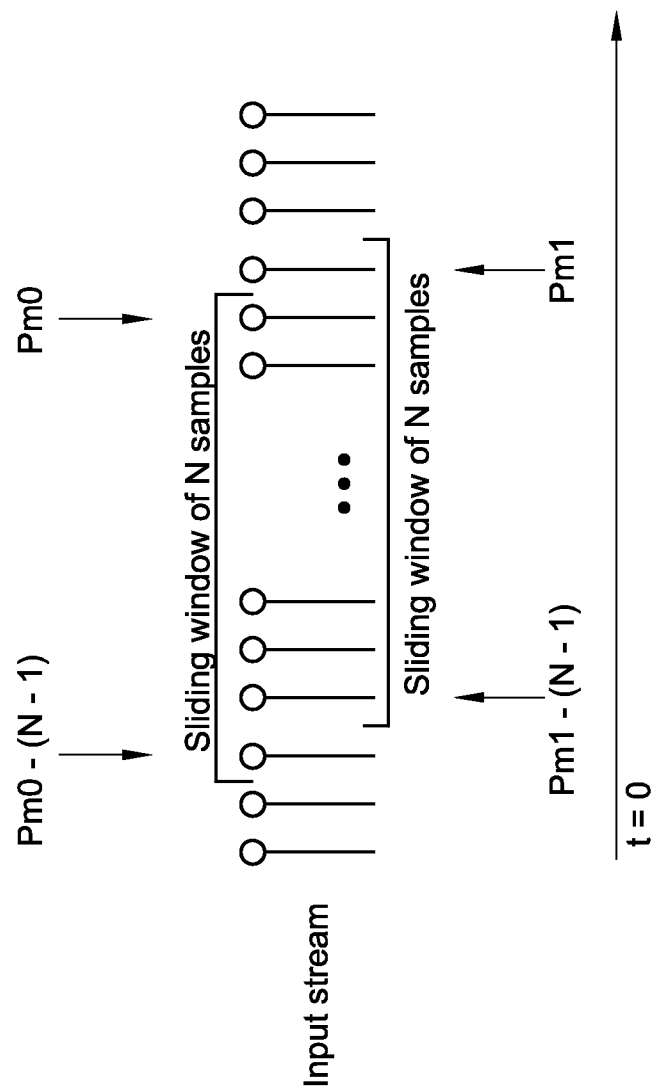
FIG. 12 illustrates an exemplary input sample selection in a multi-branch polyphase rate change filter.

In the rate change filter 20 with two branches 24, the input sample stream is effectively scanned by two sliding windows of N samples, implemented as shift registers 26 in the different branches 24, as shown on FIG. 12. The positions of the read pointers $P_{m0}$ and $P_{m1}$ are controlled by the state machines Sm0 and Sm1. There is an offset of one state between the two states machines, and every clock cycle, both state machines are incremented by two states. With this method, the input samples are selected in the same order that they would be selected if the rate change filter 20 only had one branch operating at twice the speed.

Instead of writing the input sample stream to two identical input buffers 22, a designer can choose to write the input data to a single buffer. In this situation, the two read pointers $P_{m0}$ and $P_{m1}$ are still needed, and they are still used in the same way. The only difference is that some control logic is required to ensure that only one pointer has access to the memory location in case of a pointer collision (i.e. both read pointers are reading the same address at the same time).

In case the input rate (input clock domain) is too fast to be implemented in hardware, many parallel write pointers, for example L write pointers, can be used to write to contiguous input buffer addresses. On startup, write pointer 0 is initialized to address 0, write pointer 1 is initialized to address 1, and so on up to write pointer L−1. Every clock cycle, each write pointer is incremented by L addresses, and they wrap around when they reach the maximum input buffer address.

Coefficient Distribution

In a polyphase FIR rate change filter, output sample 0 is generated using the coefficients of phase 0, output sample 1 is generated using the coefficients of phase 1, and so on until the maximum number of phases is reached (upsampling factor). Then, the process restarts at phase 0. In the dual-branch rate change filter, for the first output sample, Branch 0 will be provided with the coefficients of phase 0 and Branch 1 will be provided with the coefficients of phase 1. Then for the second output sample, Branch 0 will be provided with the coefficients of phase 2 and Branch 1 will be provided with the coefficients of phase 3. This process goes on until phase U−1 is reached. Then, the process restarts at phase 0. When the upsampling factor U is an even number, Branch 0 is always fed with the coefficients of even phases and Branch 1 is always fed with the coefficients of odd phases. However, when the upsampling factor U is an odd number, each branch 24 is provided in alternation with the coefficients of even and odd phases. Every time phase U−1 is reached, each branch 24 switches between even and odd phases.

One approach to implement the coefficient distribution in hardware is to program a true dual-port RAM with the coefficients already interleaved by phases, in the right order. This approach means that the memory location zero would contain all the coefficients of phase zero, memory location one would contain all the coefficients of phase one, and so on up to phase U−1. The first read pointer provides the coefficients for branch 0 and the second read pointer provides the coefficients for branch 1. Initially, the read pointer of Branch 0 is set to zero, and the read pointer of Branch 1 is set to one. Every clock cycle, both read pointers are incremented by two addresses, and they wrap around when they reach the maximum number of phases.

The same process can be implemented using two identical single-port RAMs also programmed with the coefficients already interleaved by phases, in the right order. The first coefficient memory provides the coefficients for Branch 0 and the second coefficient memory provides the coefficients for Branch 1. Initially, the coefficient memory read pointer of Branch 0 is set to zero, and the coefficient memory read pointer of Branch 1 is set to one. Every clock cycle, both read pointers are incremented by two addresses, and they wrap around when they reach the maximum number of phases. The drawback of this approach is that half of the memory area is wasted in hardware because of duplications.

Figure 13:
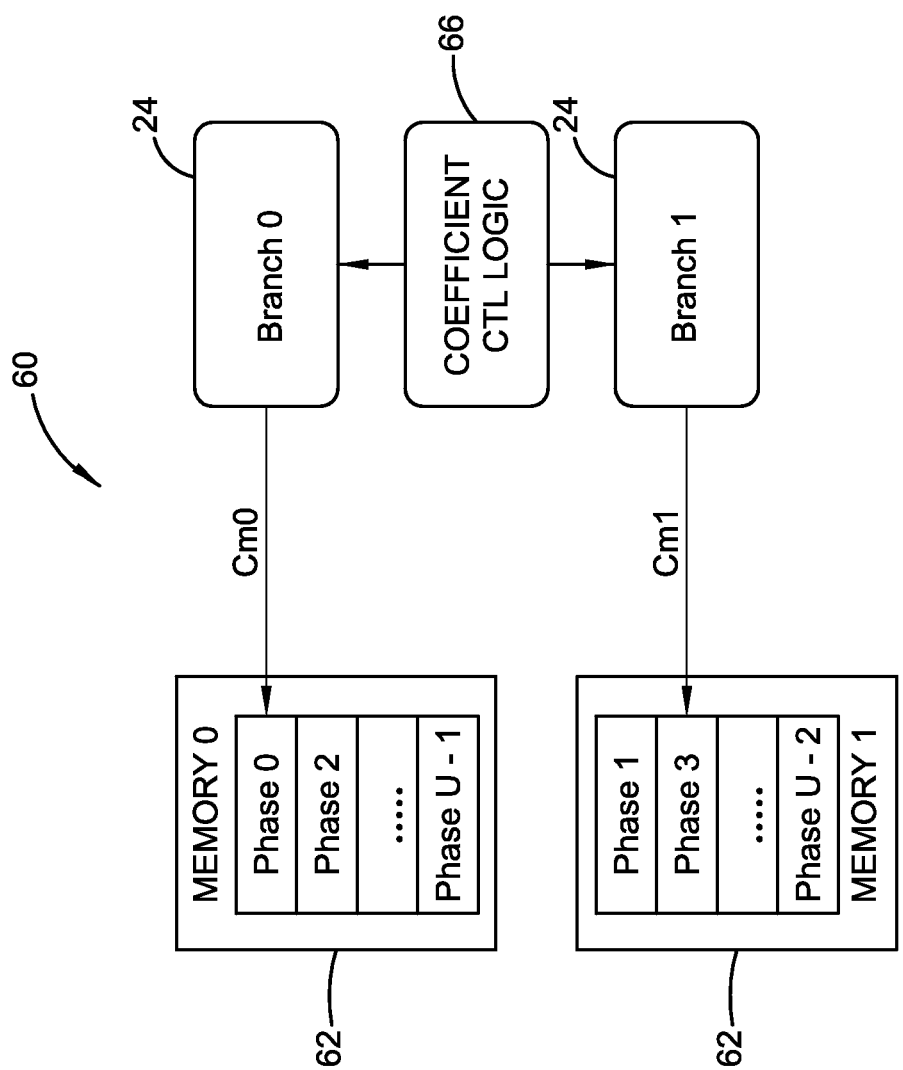
FIG. 13 illustrates an exemplary coefficient selection circuit for a multi-branch polyphase rate change filter.

Instead of using two identical single-port RAMs as in paragraph 061, the filter coefficients can be separated into two halves using two single-port RAMs filled with half of the filter impulse response. FIG. 13 illustrates an exemplary circuit 60 for managing filter coefficients. The circuit includes coefficient memory 62 for storing the filter coefficients and read pointer $C_{m0}$ and $C_{m1}$ for feeding filter coefficients to respective branches 24. When the upsampling factor U is an even number, the even phases are stored in the first coefficient memory Mem0, and the odd phases are stored in the second coefficient memory Mem1. The first memory Mem0 provides coefficients for Branch 0 and the second memory Mem1 provides coefficient for Branch 1. Memory read pointers $C_{m0}$ and $C_{m1}$ are initialized to address zero and they are incremented by one address every clock cycle. The pointers $C_{m0}$ and $C_{m1}$ wrap around when they reach the maximum address, which corresponds to the maximum number of phases divided by two.

Figure 14:
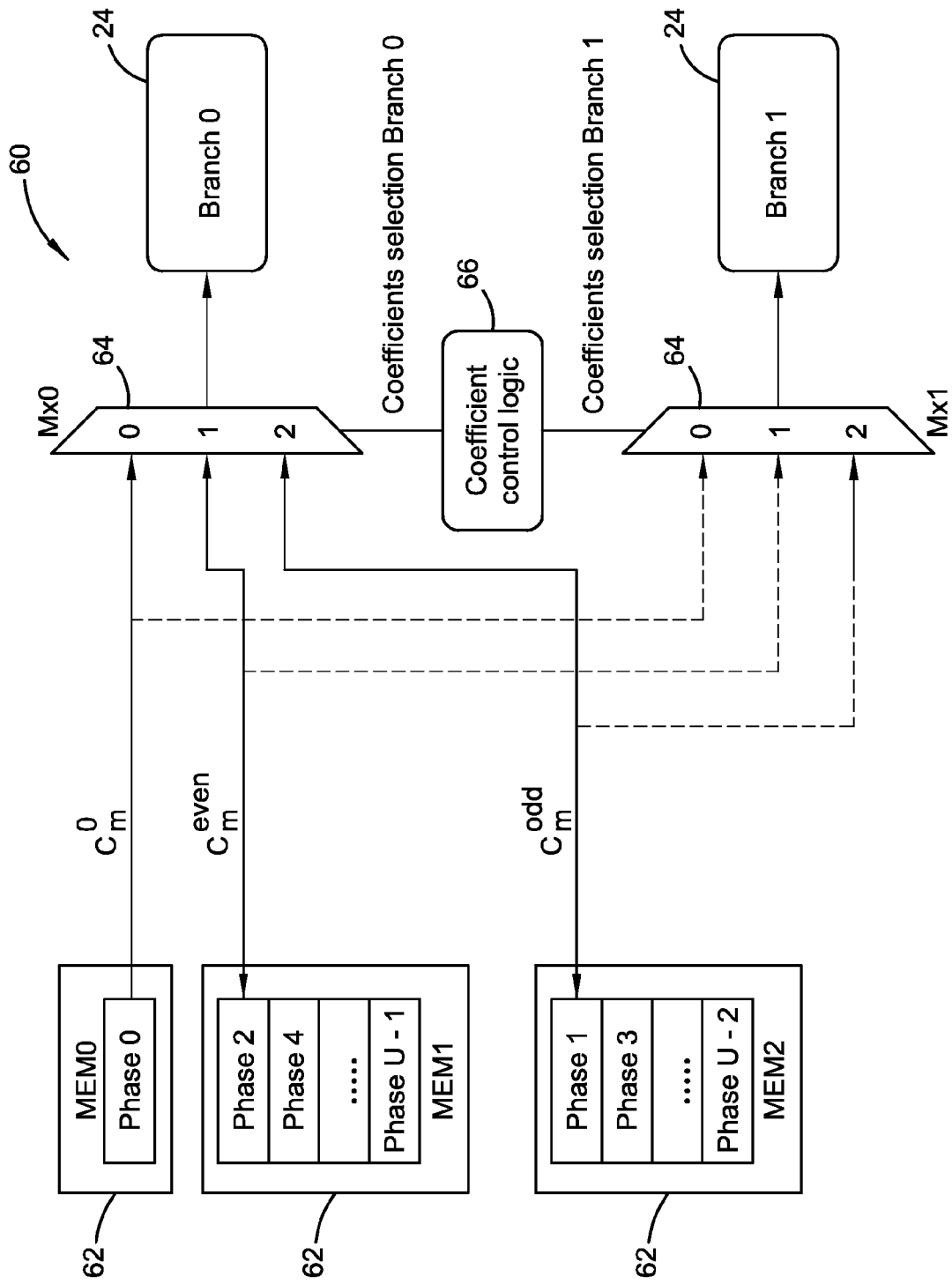
FIG. 14 illustrates an alternative coefficient selection circuit for a multi-branch polyphase rate change filter.

However, when the upsampling factor U is an odd number, three coefficients memories 62 are needed as well as some extra control logic to coordinate the operations. FIG. 14 illustrates an exemplary circuit 60 for distributing coefficients in a rate change filter 20 with an odd upsampling factor U. In this embodiment, three separate coefficient memories 62 are used to store the filter coefficients. Mem0 stores the coefficients for Phase 0, Mem1 stores the coefficients for even phases, and Mem3 stores the coefficients for odd phases. The read pointers ($C_m^0, C_m^{even}, C_m^{odd}$) for each memory are applied to the inputs of coefficient multiplexers 64 for Branch 0 and Branch 1 respectively. On startup, the coefficient multiplexer 64 for Branch 0, denoted Mx0, is set to 0 to output filter coefficients for phase 0, and the coefficient multiplexer 64 of Branch 1, denoted Mx1, is set to 2 to output filter coefficients for odd phases. Immediately after the first sample has been processed, the coefficient control logic 66 switches the coefficient multiplexer Mx0 to 1 to output filter coefficients for the even phases from 2 to U−1. Meanwhile, Branch 1 keeps processing odd phases until phase U−2 is reached. After phase U−2 is processed in Branch 1, multiplexer Mx1 is set to 0 for one clock cycle to output filter coefficients for phase 0, and then the coefficient multiplexer Mx1 is set to 1 to output filter coefficients for even phases from 2 to U−1. At the same time, as soon as Branch 0 completes the processing of even phases, the control logic switches coefficient multiplexer Mx0 of Branch 0 switches to 2, to output filter coefficients for odd phases from 1 to U−2.

Table 2 illustrates this process for an upsampling factor of 5. In this example, phase 0 is used as a separator between odd and even phases.

TABLE 2

Example of Coefficient Distribution (5 Phases)

| Cycle number | Coefficients for branch 0 | Coefficients for branch 1 |
|---|---|---|
| 0 | Phase 0 | Phase 1 (odd) |
| 1 | Phase 2 (even) | Phase 3 (odd) |
| 2 | Phase 4 (even) | Phase 0 |
| 3 | Phase 1 (odd) | Phase 2 (even) |
| 4 | Phase 3 (odd) | Phase 4 (even) |

The particular example presented in this second alternative embodiment (paragraphs 062-064) for odd upsampling factors considers that phase 0 is stored separately, in a different memory. Note however that a designer could also use phase U−1 as the separator, and re-organize the coefficients selection control logic accordingly. This second alternative embodiment is not very flexible in the sense that it cannot support both even and odd upsampling factors. However, it can be used in applications where the rate change filter ratio is always constant.

The methods and apparatus herein described allow design teams to double, and possibly multiply by some larger factors, the processing speed available in digital hardware for a polyphase FIR rate change filter 20. This invention is technology independent. The implementation algorithm presented in this disclosure enables processing speeds which are not possible to realize using the existing technologies such as ASICs and FPGAs, by solving the problem of coordinating many branches 24 in a polyphase FIR rate change filter 20.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method implemented by a rate change filter of filtering an input sample stream having a first sample rate to generate an output sample stream having a second sample rate greater than the first sample rate, said method comprising:
   inputting the sample stream to a rate change filter with two or more filter branches having offset states; and
   filtering the input sample stream in parallel filter branches with filter coefficients corresponding to different phases to generate a multiple output sample substreams.

2. The method of claim 1 wherein filtering the input sample stream in parallel filter branches comprises:
   multiplying, during successive output clock cycles, the input samples fed to each filter branch by a corresponding set of filter coefficients to generate a set of products and summing said products for each parallel filter branch to generate corresponding output samples.

3. The method of claim 2 wherein inputting the sample stream to a rate change filter with two or more filter branches having offset states comprises, for each parallel filter branch:
   computing an input sample pointer for successive output clock cycles; and
   shifting, during said successive output clock cycles, one or more input samples into said parallel filter branch in dependence on said input sample pointer.

4. The method of claim 3 wherein said input sample pointers for said parallel filter branches are computed by independent state machines associated with respective filter branches.

5. The method of claim 2 wherein inputting the sample stream to a rate change filter with two or more filter branches having offset states further comprises:
   inputting said input sample stream into two or more input buffers dedicated to respective filter branches: and
   shifting, during said successive output clock cycles, input samples into said parallel filter branches from respective ones of said dedicated input buffers.

6. The method of claim 5 wherein inputting the sample stream to a rate change filter with two or more filter branches having offset states comprises:
   computing, for each filter branch, an input sample pointer for each output clock cycle; and
   shifting input samples from said input buffers into respective parallel filter branches in dependence on the input sample pointers.

7. The method of claim 6 wherein said input sample pointers for said parallel filter branches are computed by independent state machines associated with respective filter branches.

8. The method of claim 6 wherein inputting the sample stream to a rate change filter with two or more filter branches having offset states further comprises shifting, during at least one output clock cycle, two or more input samples into one of said parallel shift registers by shifting one input sample each from a respective input buffer and at least one other input buffer.

9. The method of claim 2 wherein multiplying, during each output clock cycle, the input samples for each parallel filter branch by a corresponding set of filter coefficients comprises:
   computing a phase for each parallel filter branch; and
   selecting, for each parallel filter branch, a subset of the corresponding set of filter coefficients in dependence on said phase; and
   multiplying the input samples in each filter branch by the selected subset filter coefficients.

10. A rate change filter for filtering an input sample stream having a first sample rate to generate an output sample stream having a second sample rate greater than the first sample rate, said rate change filter comprising:
    two or more parallel filter branches with offset states to filter the input sample streams using filter coefficients in each branch corresponding to different phases and to generate multiple output substreams; and
    a control circuit to control input of the input sample stream to the filter branches and the selection of filter coefficients for the parallel filter branches.

11. The rate change filter of claim 10 wherein each filter branch comprises:
    a shift register having a plurality of registers to receive input samples in said input sample stream;
    a plurality of multipliers to multiply, during successive output clock cycles, the input samples input to said shift register to generate a set of products;
    a plurality of adders to sum said products to generate corresponding output samples.

12. The rate change filter of claim 11 wherein the control circuit is configured to:
    compute an input sample pointer for successive output clock cycles; and
    shift, during said successive output clock cycles, one or more input samples into said parallel filter branch in dependence on said input sample pointer.

13. The rate change filter of claim 11 wherein the control circuit comprises separate state machines associated with respective filter branches to compute said input sample pointers for respective parallel filter branches.

14. The rate change filter of claim 13 wherein the control circuit further comprises input control logic configured to:
    input said input sample stream into two or more input buffers dedicated to respective filter branches: and
    shift, during said successive output clock cycles, input samples into said parallel filter branches from respective ones of said dedicated input buffers.

15. The rate change filter of claim 14 wherein the control circuit comprises:
    separate state machines associated with respective filter branches to compute, for respective filter branches, an input sample pointer for each output clock cycle; and
    input control logic to shift input samples from said input buffers into respective parallel filter branches in dependence on the input sample pointers.

16. The rate change filter of claim 15 wherein said input sample pointers for said parallel filter branches are computed by independent state machines associated with respective filter branches.

17. The rate change filter of claim 15 wherein the input control logic is further configured to shift, during at least one output clock cycle, two or more input samples into one of said parallel shift registers by shifting one input sample each from two or more input buffers.

18. The rate change filter of claim 11 wherein the control circuit further comprises coefficient control logic configured to:
    compute a phase for each parallel filter branch; and
    select, for each parallel filter branch, a subset of the corresponding set of filter coefficients in dependence on said phase.

* * * * *

UNITED STATES PATENT AND TRADEMARK OFFICE
CERTIFICATE OF CORRECTION

PATENT NO. : 8,768,995 B2
APPLICATION NO. : 13/119163
DATED : July 1, 2014
INVENTOR(S) : Laporte It is certified that error appears in the above-identified patent and that said Letters Patent is hereby corrected as shown below:

In the Specification

In Column 7, Line 42-44, delete " $\left\lceil \dfrac{\frac{L_x \times U}{C}}{M} \right\rceil$ " and insert -- $\left\lceil \dfrac{\frac{L_x \times U}{D}}{M} \right\rceil$ --, therefor.

In Column 9, Line 28, delete "of equal" and insert -- or equal --, therefor.

In Column 9, Line 33, delete "of equal" and insert -- or equal --, therefor.

In Column 9, Line 53, delete "then" and insert -- than --, therefor.

In Column 11, Line 1, delete "subtractor 51" and insert -- subtracter S1 --, therefor.

Signed and Sealed this
Fourteenth Day of October, 2014

Michelle K. Lee
*Deputy Director of the United States Patent and Trademark Office*